United States Patent [19]

Calzi

[11] Patent Number: 4,897,569
[45] Date of Patent: Jan. 30, 1990

[54] CMOS AMPLIFIER FOR MEMORIES

[75] Inventor: Philippe Calzi, Bouc Bel Air, France

[73] Assignee: SGS-Thomson Microelectronics S.A., Paris, France

[21] Appl. No.: 158,710

[22] Filed: Feb. 22, 1988

[30] Foreign Application Priority Data

Feb. 24, 1987 [FR] France .................................. 87 02371

[51] Int. Cl.$^4$ ............................................ H03K 17/16
[52] U.S. Cl. .................................... 307/530; 307/443; 307/491; 307/568; 365/208
[58] Field of Search ............... 307/530, 443, 490, 491, 307/572, 264, 279, 552, 554, 568; 330/9, 51, 253, 257, 277; 365/189, 202, 203, 205, 208

[56] References Cited

U.S. PATENT DOCUMENTS

| | | | |
|---|---|---|---|
| 4,110,641 | 8/1978 | Payne | 307/355 |
| 4,150,311 | 4/1979 | Matsuda et al. | 307/530 |
| 4,301,519 | 11/1981 | Lee | 307/538 |
| 4,616,148 | 10/1986 | Ochii et al. | 307/530 |
| 4,634,890 | 1/1987 | Lee | 307/530 |
| 4,724,339 | 2/1988 | Ishida | 330/51 |
| 4,736,117 | 4/1988 | Wieser | 307/568 |
| 4,740,760 | 4/1988 | Phan | 330/253 |

OTHER PUBLICATIONS

IEEE International Solid-State Circuit Conference, vol. 28, Conf. 32, Feb. 85, pp. 64–64, 306, IEEE, Coral Gales, Fla. U.S.; K. Ochii et al., "17 ns 64K CMOX RAM With a Schmitt Trigger Sense Amplifier".
Patent Abstracts of Japan, vol. 7, No. 64 (P-183), Mar. 17, 1983, JP-A-57 208 609.
Electronic Design, vol. 33, No. 9, Apr. 1985, pp. 52–54, Hasbrouck Heights, N.J., U.S.; D. Bursky "CMOS ICs Handle High-Voltage Needs of RS-232 Interface".

Primary Examiner—Stanley D. Miller
Assistant Examiner—Timothy P. Callahan
Attorney, Agent, or Firm—Oblon, Spivak, McClelland, Maier & Neustadt

[57] ABSTRACT

A read amplifier for memories, using C-MOS technology, consists of a differential stage comprising an balancing circuit used, during the balancing phase, by means of a pre-charging signal and means to memorize the state of the differential stage output during the balancing phase. The invention can be applied especially to RAMs.

6 Claims, 1 Drawing Sheet

FIG_1 PRIOR ART
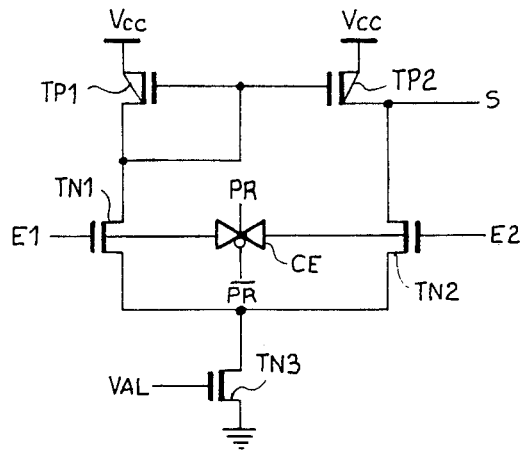
FIG_2
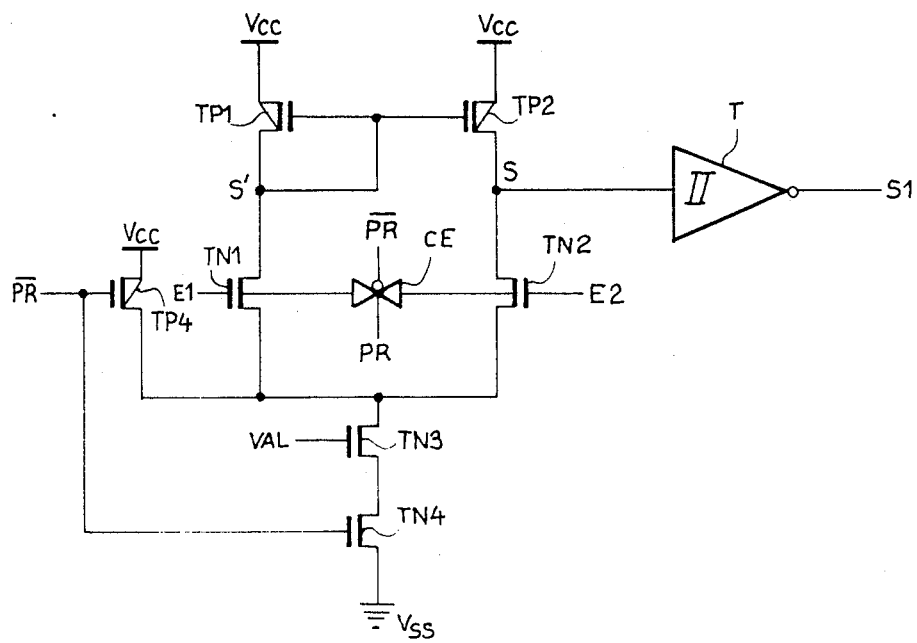

CMOS AMPLIFIER FOR MEMORIES

BACKGROUND OF THE INVENTION

1. Field of the Invention

The present invention pertains to integrated circuits made with C-MOS (complementary metal oxide semiconductor) technology, and more especially to a read amplifier for memories.

2. Description of the Prior Art

In integrated circuit memories such as RAMs (random-access memories) or similar memories, the data recorded in the memory cells is generally read by means of differential amplifiers. As shown in FIG. 1, which pertains to a circuit made with C-MOS technology, the differential amplifiers used comprise, in a conventional type of assembly, a current supply source consisting of an N type MOS transistor TN3 supplying current, in parallel, to two groups of series-connected MOS transistors, respectively consisting, firstly, of an N type MOS transistor TN1 and a P type MOS transistor TP1 and, secondly, of an N type MOS transistor TN2 and a P type MOS transistor TP2.

More specifically, the two groups of MOS transistors, namely TN1, TP1 and TN2, TP2, are mounted between the drain of the MOS transistor TN3 and the power supply voltage $V_{cc}$. The control gates of the transistors TN1 and TN2 constitute the inputs E1 and E2 of the differential stage. Furthermore, the assembly described with reference to FIG. 1 is a conventional arrangement of a differential stage with five MOS transistors in a current mirror assembly. Thus, the drain of the MOS transistor TP1 is connected with its control gate which is itself, connected to the control gate of the transistor TP2. In this case, a single, zero or positive, non-differential output voltage S is obtained. This output S is obtained at the drain of the transistor TN2.

This differential stage further comprises an balancing circuit CE consisting, in a known way, of a conventional type of transfer gate controlled by a pre-charging signal PR and its inverted signal $\overline{PR}$. This circuit can be used, during an balancing stage, achieved before each read operation, to position the output S of the differential stage towards its common-mode value, namely the value of the output voltage when the inputs E1 and E2 are short-circuited. This balancing circuit is essential in read amplifiers to obtain very fast access times.

However, this balancing circuit has a number of disadvantages. For, if the common-mode value corresponds to a logical level "1" and if two logical levels "0" have to be read successively at the output, there will be a signal with two switch-overs at the output S, i.e. at the start of the balancing process, a transition from a logical level "0" to a logical level "1" followed, during reading, by a transition from a logical level "1" to the logical level "0". Now this entails an increase in the consumption of the circuit and creates a risk of noise in the power supplies.

SUMMARY OF THE INVENTION

An aim of the present invention is to remove these diadvantages by proposing an improvement in read amplifiers for memories of the type consisting of a differential stage comprising a balancing circuit.

Consequently, an object of the present invention is a read amplifier for memories using C-MOS technology, the said amplifier consisting of a differential stage, comprising an balancing circuit used during the balancing stage by means of a pre-charging signal, and further comprising means to memorize the state of the differential stage output during the balancing phase.

According to a preferred embodiment, the means for memorizing the state of the differential stage output during the balancing phase consist, firstly, of a MOS transistor, mounted between the power supply voltage and the electrode connected to the low voltage of the differential stage input transistors, the gates of which are controlled by the pre-charging signal and, secondly, of a threshold amplifier. Preferably, the MOS transistor is a P type MOS transistor and the threshold amplifier is a Schmitt trigger.

According to another characteristic of the present invention, to prevent any increase in the consumption of the circuit, the read amplifier further comprises means used to prevent any excess consumption.

According to a preferred embodiment, the said means consist of a MOS transistor which is series mounted between the current source of the differential stage and the ground, the gate of the said MOS transistor being controlled by the pre-charging signal.

BRIEF DESCRIPTION OF THE DRAWINGS

Other characteristics and advantages of the present invention will emerge from the following description of an embodiment, made with reference to the appended drawings, of which:

FIG. 1, already described, is a diagram of a read amplifier according to the prior art, and FIG. 2 represents an electrical diagram of a preferred embodiment of a read amplifier according to the present invention.

DESCRIPTION OF A PREFERRED EMBODIMENT

To simplify the description, the same references are repeated for the same elements in the figures. Furthermore, the present invention has been described with reference to a particular embodiment of a differential stage using C-MOS technology. However, it is obvious to those skilled in the art that it can also be used with other embodiments using C-MOS technology.

FIG. 2 shows an embodiment of a read amplifier for memories according to the present invetion. This read amplifier comprises a differential stage as well as an balancing circuit, the set being identical to the read amplifier shown in FIG. 1. More specifically, the differential stage has a current source comprising the N type MOS transistor TN3, the gate of which is controlled by an enable signal VAL.

According to the present invention, the source of the MOS transistor TN3 is connected to the ground or to a low voltage $V_{ss}$ by means of another N type MOS transistor TN4, the role of which shall be explained in greater detail below.

Furthermore, the differential stage has two sets of MOS transistors that are parallel mounted between the drain of the transistor TN3 and the power supply voltage $V_{cc}$. These two sets each consist of an N type MOS transistor, TN1 or TN2, series mounted with a P type MOS transistor, TP1 or TP2. More specifically, the drain of TN3 is connected to the source of the N type MOS transistor TN1 or TN2, the drain of which is connected to the drain of the P MOS transistor TP1 or TP2, the source of which is connected to the power supply voltage.

Furthermore, the gates of the MOS transistors, TN1 and TN2, respectively receive the input signals E1 and E2 of the differential stage. Moreover, the assembly shown is a so-called current mirror assembly. Consequently, the gates of the transistors TP1 and TP2 are connected together and the drain of the transistor TP1 is connected to its gate. As a result, the output S of the differential stage is obtained at the drain of the transistor TP2.

The balancing circuit CE consists of a known type of transfer gate, which are connected between the gates of the transistors TN1 and TN2 and which receive the pre-charging signal PR and its inverted signal $\overline{PR}$.

According to the present invention, a P type MOS transistor TP4 is mounted between the power supply voltage $V_{cc}$ and the source of the transistors TN1 and TN2, i.e. the electrode connected to the low voltage of the input transistors of the differential stage. The gate of the MOS transistor TP4 is controlled by the inverted pre-charging signal $\overline{PR}$. Furthermore, the inverted pre-charging signal $\overline{PR}$ also controls the gate of the N type MOS transistor TN4, mounted between the source of the MOS transistor TN3 and the low voltage $V_{ss}$.

According to another characteristic of the present invention, a threshold amplifier such as a Schmitt trigger 7 is connected to the output S of the differential stage.

We shall now explain the working of the read amplifier for memories according to the present invention.

During the balancing stage, namely when the signal $\overline{PR}$ is at the logical level "0", the MOS transistor TN4 is off, making it possible to cut off the power supply and thus prevent excess consumption. At the same time, the MOS transistor TP4 comes on and imposes a potential equal to the power supply voltage $V_{cc}$ on the sources of the input transistors TN1 and TN2. Consequently, the TN1 and TN2 transistors are turned off by substrate effect. As a result of this, the points S and S' are insulated from the low voltage $V_{ss}$, and can change only through the action of the MOS transistors TP1 and TP2.

In fact, the transistor TP1 is mounted as a resistor. Hence, the potential S' is imposed by this assembly and, regardless of the level of the output S, the voltage VS' will be substantially equivalent in both cases. Since a current mirror arrangement is used, the currents in both arms of the differential amplifier will be the same. The same will therefor be true for the voltage variation, whence the equations:

$$VS(2) = VS(1) + \Delta VS$$

$$VS'(2) = VS'(1) + \Delta VS'$$

with $\Delta VS = \Delta VS' = VS'(2) - VS'(1)$ and VS(1) and VS(2) referring to the first phase prior to precharging and the second phase during pre-charging, respectively.

Thus, with a two-micrometer circuit using C-MOS technology, in which the transistors TP1 and TP2 have been chosen such that their W/L ratio = 30/2.5 and the transistors TN1 and TN2 have been chosen such that their W/L ratio = 25.2, if the output S is at the logical level "1" we get, with a supply voltage $V_{cc}$, of 5 volts: VS(1)≃4.8 volts and VS'(1)≃3.2 volts.

If the output S' is at the logical level "0", we get: VS(1)≃0.8 volts and VS'(1)≃3.5 volts.

In the first case, during the pre-charging, the source of the transistors TN1 and TN2 is placed substantially at $V_{cc}$ and the inputs E1 and E2 are short-circuited. In this case:

$$VS'(2) \rightarrow V_{cc} - VTP$$

whence: VS'(2)≃4.4 volts $$VS(2) \rightarrow VS(1) + VS'(2) - VS'(1)$$

whence: VS(2)≃$V_{cc}$

In the second case, during the pre-charging:

$$VS'(2) \rightarrow V_{cc} - |VTP|$$

whence: VS'(2)≃4.4 volts $$VS(2) \rightarrow VS'(1) + VS'(2) - VS'(1)$$

whence: VS(2)≃1.7 volts

As shown in FIG. 2, to obtain a well specified high level and low level at the output S1, S is connected to a Schmitt trigger T which switches over for a voltage of about 3.0 volts. Consequently, the low level, 1.7 volts, will be seen as a logical level 0.

What is claimed is:

1. A read amplifier for a memory using CMOS technology, said amplifier comprising a differential amplifier having two inputs and two differential branches connected in parallel between a current source and a supply voltage, said amplifier further comprising an output for providing a voltage corresponding to one of a first and second logic level, and a balancing circuit controlled by a precharge signal, said balancing circuit comprising means for short-circuiting the two inputs of the differential amplifier during a balancing phase, wherein there is further provided means controlled by said precharge signal for establishing on the output of said differential amplifier during said balancing phase either a voltage substantially corresponding to a high logic level if the voltage on said output prior to the balancing phase was at a high logic level, or a voltage substantially corresponding to a low logic level if the voltage on said output prior to said balancing phase was at a low logic level.

2. A read amplifier according to claim 1, wherein said means for establishing voltages on the output comprise a first MOS transistor connected between said supply voltage and said current source.

3. A read amplifier according to claim 2, wherein said first MOS transistor is a P channel transistor.

4. A read amplifier according to claim 1, further comprising a threshold amplifier connected at the output of said differential amplifier.

5. A read amplifier according to claim 4, wherein said threshold amplifier is a Schmit trigger.

6. The read amplifier according to claim 1, wherein said means for establishing voltages on the output of the amplifier comprises a second MOS transistor connected in series with said current source and having its gate controlled by said precharge signal so as to be rendered nonconductive during said balancing phase and conductive outside said balancing phase.

* * * * *